(12) United States Patent
Wan (10) Patent No.: US 10,958,227 B2
(45) Date of Patent: Mar. 23, 2021

(54) AMPLIFIER NONLINEAR OFFSET DRIFT CORRECTION

(71) Applicant: Analog Devices, Inc., Norwood, MA (US)

(72) Inventor: Quan Wan, Belmont, MA (US)

(73) Assignee: Analog Devices, Inc., Norwood, MA (US)

( * ) Notice: Subject to any disclaimer, the term of this patent is extended or adjusted under 35 U.S.C. 154(b) by 156 days.

(21) Appl. No.: 16/405,568

(22) Filed: May 7, 2019

(65) Prior Publication Data
US 2020/0358412 A1 Nov. 12, 2020

(51) Int. Cl.
*H03F 3/45* (2006.01)
*H03F 1/30* (2006.01)

(52) U.S. Cl.
CPC ......... *H03F 3/45475* (2013.01); *H03F 1/303* (2013.01); *H03F 3/45968* (2013.01)

(58) Field of Classification Search
CPC .................................................. H03F 3/4547
See application file for complete search history.

(56) References Cited

U.S. PATENT DOCUMENTS

| | | | | |
|---|---|---|---|---|
| 5,744,993 A * | 4/1998 | Sonntag | ................... | G11B 5/02 327/307 |
| 5,848,383 A * | 12/1998 | Yunus | ................... | G01D 3/022 702/104 |
| 6,188,281 B1 * | 2/2001 | Smith | ................... | H03F 3/3076 330/252 |
| 6,255,807 B1 | 7/2001 | Doorenbos et al. | | |
| 7,398,173 B2 * | 7/2008 | Laraia | ................. | G01D 18/008 702/99 |
| 2002/0171484 A1 * | 11/2002 | Sundstorm | ............ | H03F 1/3247 330/136 |
| 2009/0098839 A1 * | 4/2009 | Hara | ....................... | H03C 1/62 455/102 |
| 2009/0115523 A1 * | 5/2009 | Akizuki | ............. | H03F 3/45183 330/260 |

(Continued)

FOREIGN PATENT DOCUMENTS

| | | |
|---|---|---|
| CN | 1508643 A | 6/2004 |
| CN | 1987713 A | 6/2007 |
| CN | 101901020 A | 12/2010 |

(Continued)

OTHER PUBLICATIONS

Martinez-Nieto, A., et al., "A bandgap voltage reference in 0.18m CMOS technology", IEEE 56th Intl. Midwest Symposium on Circuits and Systems (MWSCAS), (2013), 4 pgs.

(Continued)

*Primary Examiner* — Patricia T Nguyen
(74) *Attorney, Agent, or Firm* — Schwegman Lundberg & Woessner P.A.

(57) ABSTRACT

An amplifier circuit comprises a differential input stage configured to receive a differential input signal, wherein the differential input stage is susceptible to an offset error that includes a linear offset error portion and a nonlinear offset error portion; and an offset error correction circuit coupled to the differential input stage and configured to apply a second order error correction signal to the differential input stage to reduce the nonlinear portion of the offset error.

20 Claims, 10 Drawing Sheets

(56) References Cited

U.S. PATENT DOCUMENTS

2010/0316172 A1* 12/2010 Keehr .................. H04B 1/109
375/344

FOREIGN PATENT DOCUMENTS

| CN | 102122190 | A | 7/2011 |
| CN | 102279611 | A | 12/2011 |
| CN | 202110463 | U | 1/2012 |
| CN | 102591398 | B | 2/2014 |
| CN | 102981545 | B | 8/2014 |
| CN | 103365331 | B | 12/2014 |
| CN | 104714588 | A | 6/2015 |
| CN | 204440214 | U | 7/2015 |
| CN | 104375554 | B | 11/2015 |
| CN | 105320199 | A | 2/2016 |
| CN | 107092297 | A | 8/2017 |
| CN | 206757446 | U | 12/2017 |
| CN | 207067835 | U | 3/2018 |
| CN | 108664072 | A | 10/2018 |
| CN | 107045370 | B | 12/2018 |

OTHER PUBLICATIONS

Najafizadeh, Laleh, "Voltage References Using Mutual Compensaiion of Mobiiity and Threshold Voltage Temperature Effects", MS Thesis at the U. of Alberta, (2004), 123 pgs.

Peng, Zhenyu, et al., "A High Order Temperature Curvature Compensated CMOS Bandgap Reference", IEEE 2nd Intl. Conference on Consumer Electronics, Communications and Networks (CECNet), (2012), 4 pgs.

Song, Bang-Sup, et al., "A Precision Curvature-Compensated CMOS Bandgap Reference", IEEE J. Solid-State Circuits, vol. SC-18, No. 6, (Dec. 1983), 10 pgs.

* cited by examiner

AMPLIFIER NONLINEAR OFFSET DRIFT CORRECTION

FIELD OF THE DISCLOSURE

This document relates to integrated circuits and in particular to amplifier circuits.

BACKGROUND

Amplifier circuits, or amplifiers, have many uses in integrated circuits. Operational amplifiers can be used to amplify signals or isolate signals present at their inputs. Difference amplifiers can be used to amplify the difference in electrical signals present at the inputs to the amplifier. Instrumentation amplifiers can be used to measurement and test equipment. Amplifier circuits can be susceptible to offset voltages at the input that are reflected at the output. It is desired to reduce or eliminate the offset voltage especially where precision measurements and control is desired.

SUMMARY OF THE DISCLOSURE

This document relates generally to amplifier circuits and more specifically to reducing the offset in amplifier circuits. In some aspects, an amplifier circuit comprises a differential input stage configured to receive a differential input signal. The differential input stage is susceptible to an offset error that includes a linear offset error portion and a nonlinear offset error portion. The amplifier also includes an offset error correction circuit coupled to the differential input stage and configured to apply a second order error correction signal to the differential input stage to reduce the nonlinear portion of the offset error.

In some aspects, a method of correcting offset error in an amplifier circuit comprises generating a second order error correction signal that includes a constant signal component, a first order temperature dependent signal component, and a second order temperature dependent signal component; and applying the generated second order error correction signal to a differential input stage of the amplifier circuit to reduce an offset error that includes a linear offset error portion and a nonlinear offset error portion, and the second order temperature dependent signal component includes a magnitude and a polarity to reduce the nonlinear offset error portion.

In some aspects, an operational amplifier circuit comprises a differential input stage configured to receive a differential input signal, wherein the differential input stage is susceptible to an offset error that includes a linear offset error portion and a nonlinear offset error portion; an output buffer stage coupled to the differential input stage; and an offset error correction circuit coupled to the differential input stage. The offset error correction circuit is configured to generate an error correction signal including a first order temperature dependent signal component, and a second order temperature dependent signal component; and apply the error correction signal to the differential input stage to reduce the linear offset error portion and the nonlinear offset error portion of the offset error.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
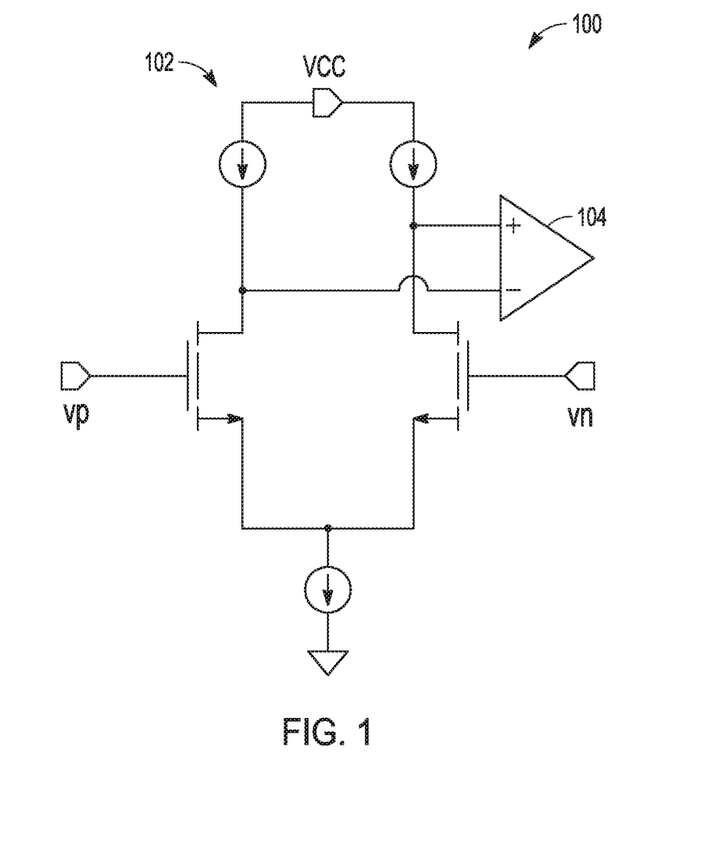
FIG. 1 is a circuit schematic of an example of an amplifier circuit.

FIG. 1 is a circuit schematic of an example of an amplifier circuit 100. The amplifier circuit includes a differential input stage 102 and an output stage 104 to buffer the output of the differential input stage. As explained above, amplifier circuits can be susceptible to offset voltages. Due to process variation and stress from circuit packaging, all amplifiers inevitably have some random offset voltage. The offset voltage often drifts with temperature. Both the offset voltage and its temperature drift can severely limit the applications in which the amplifier can be used.

Figure 2A:
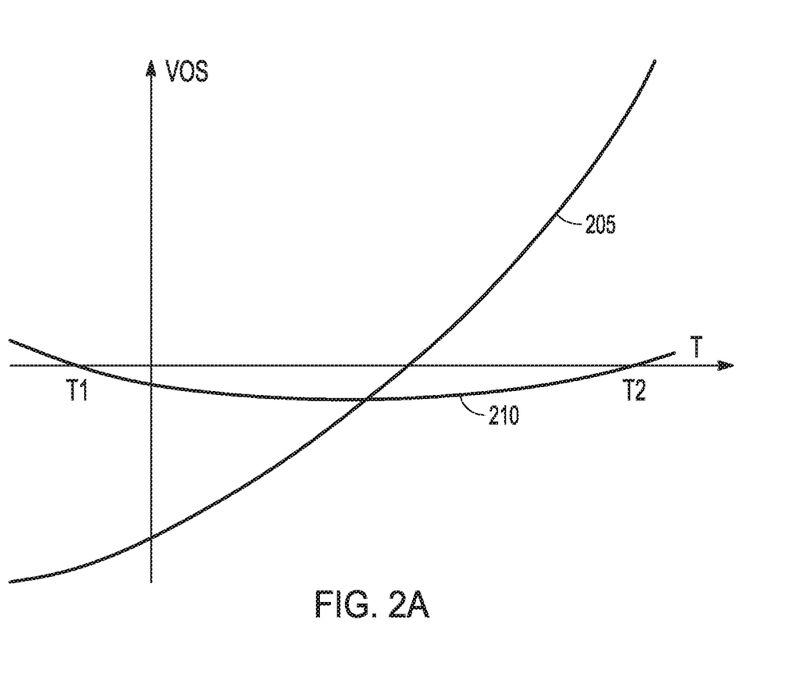
FIGS. 2A and 2B are graphs showing example waveforms of amplifier offset voltage drift with temperature.

FIG. 2A is a graph showing an example waveform 205 of amplifier offset voltage drift with temperature. The waveform 205 shows that the offset voltage variation with temperature includes a linear component and a nonlinear component that gives the waveform its curve. To reduce the offset voltage, the amplifier circuit can be trimmed at two temperatures T1 and T2. The trimming of the amplifier circuit sets the offset to zero volts at the two temperatures. This is shown in waveform 210 in FIG. 2A. The waveform 210 shows that the two-temperature trim can only remove the linear portion of the drift. The nonlinear component of the voltage drift remains and is evident in the curvature of the waveform 210. An improved approach is to correct the nonlinear component of the draft as well as the linear component.

It should be noted that FIG. 2A is only one example of offset voltage drift with temperature. While the offset drift will have a linear and nonlinear component, the magnitude of the drift and the polarity of the drift (e.g., waveform 210 can be inverted) are random due to the process variation and packaging stress.

Figure 2B:
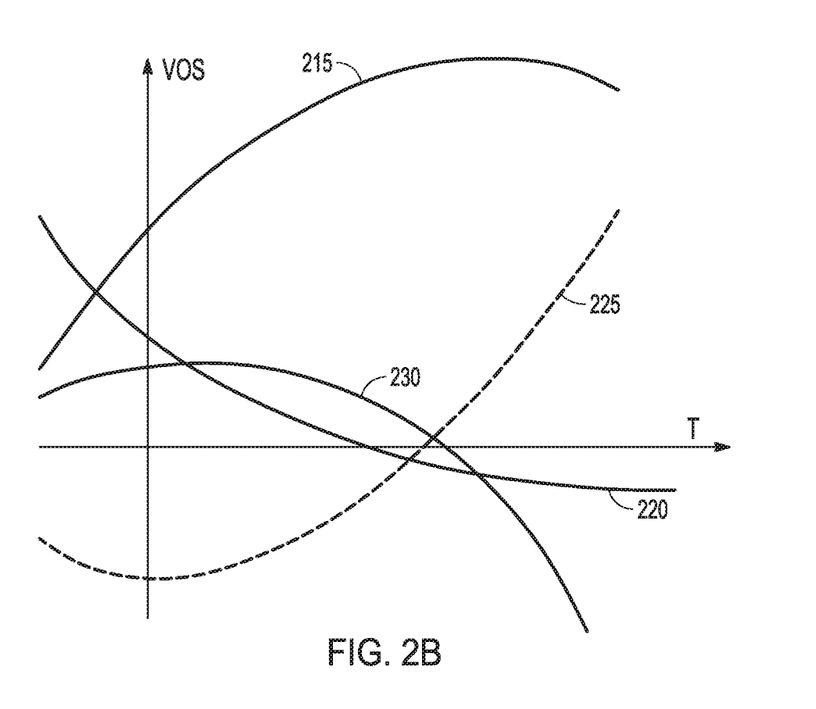

FIG. 2B is a graph showing additional example waveforms of amplifier offset voltage drift with temperature. The examples show the randomness in the magnitude and polarity of the offset voltage drift with temperature. For waveform 215, the error first increases with increasing temperature and then decreases. For waveform 220, the error first decreases with increasing temperature and then decreases more slowly. For waveform 225, the error first decreases with increasing temperature and then increases. For waveform 230, the error first increases with increasing temperature and then decreases as in waveform 215 but with different magnitude. The nonlinear component of the offset voltage waveforms is mainly due to a second order term of the offset voltage drift. An error correction signal that includes either a voltage or a current that varies as temperature squared ($T^2$) can be used to trim and reduce the nonlinear component of the offset voltage drift. The error correction approach needs to take into account the randomness in magnitude and polarity of the offset voltage drift.

Figure 3:
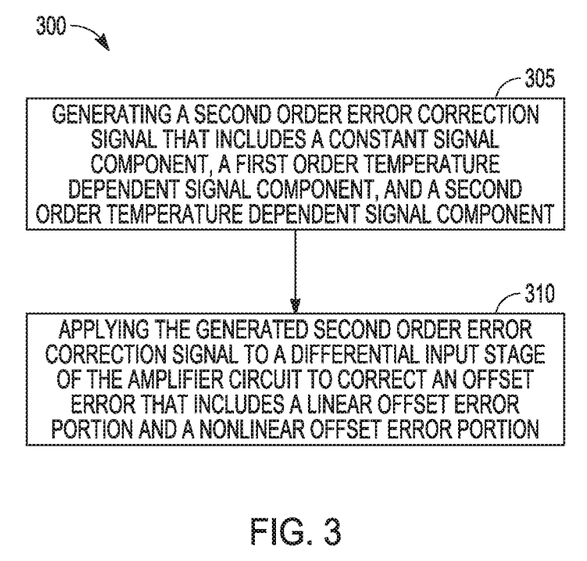
FIG. 3 is a flow diagram of an example of a method of correcting offset error in an amplifier circuit.

FIG. 3 is a flow diagram of an example of a method 300 of correcting offset error in an amplifier circuit. At 305, a second order error correction signal is generated. The second order error correction signal includes a second order temperature dependent signal component to correct the nonlinear portion of an offset voltage of the amplifier circuit. In certain aspects the second order temperature dependent signal component is a proportional to absolute temperature squared ($PTAT^2$) signal component. In some aspects, the second order temperature dependent signal component is a complementary to absolute temperature squared ($CTAT^2$) signal component. In some aspects, the second order error correction signal includes a constant signal component, a first order temperature dependent signal component, and the second order temperature dependent signal component. The first order temperature dependent signal component may be a proportional to absolute temperature (PTAT) signal component or a complementary to absolute temperature (CTAT) signal component. At 310, the generated second order error correction signal is applied to a differential input stage of the amplifier circuit (e.g., differential input stage 102 in the example of FIG. 1) to correct an offset error that includes a linear offset error portion and a nonlinear offset error portion.

Figure 4:
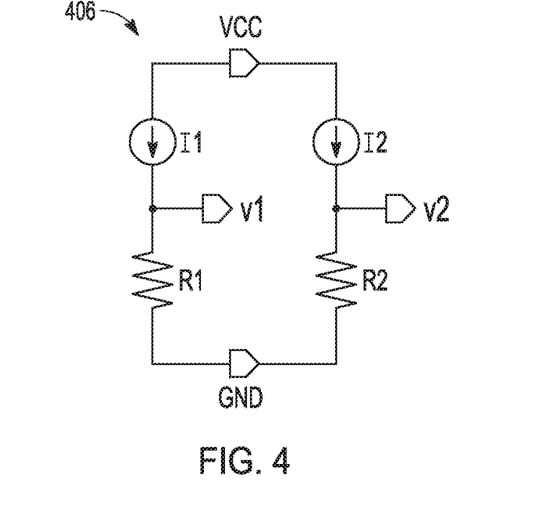
FIG. 4 is a diagram of an example of portions of an offset error correction circuit.

FIG. 4 is a diagram of an example of portions of an offset error correction circuit 406 to reduce the offset drift voltage in an amplifier circuit. The offset error correction circuit 406 produces a voltage difference signal (V2−V1) that can be used to reduce offset in amplifier circuits. The circuit 406 includes two current sources (I1 and I2) that each provide a current that is Proportional to Absolute Temperature (PTAT). Resistor R1 has a resistance with a positive temperature coefficient. In variations, resistor R1 may be a polysilicon resistor, diffusion resistor, or n-well resistor. Resistor R2 has a resistance with a different temperature coefficient than R1 (e.g., a zero temperature coefficient). Resistor R2 may be a thin film resistor.

Figure 5:
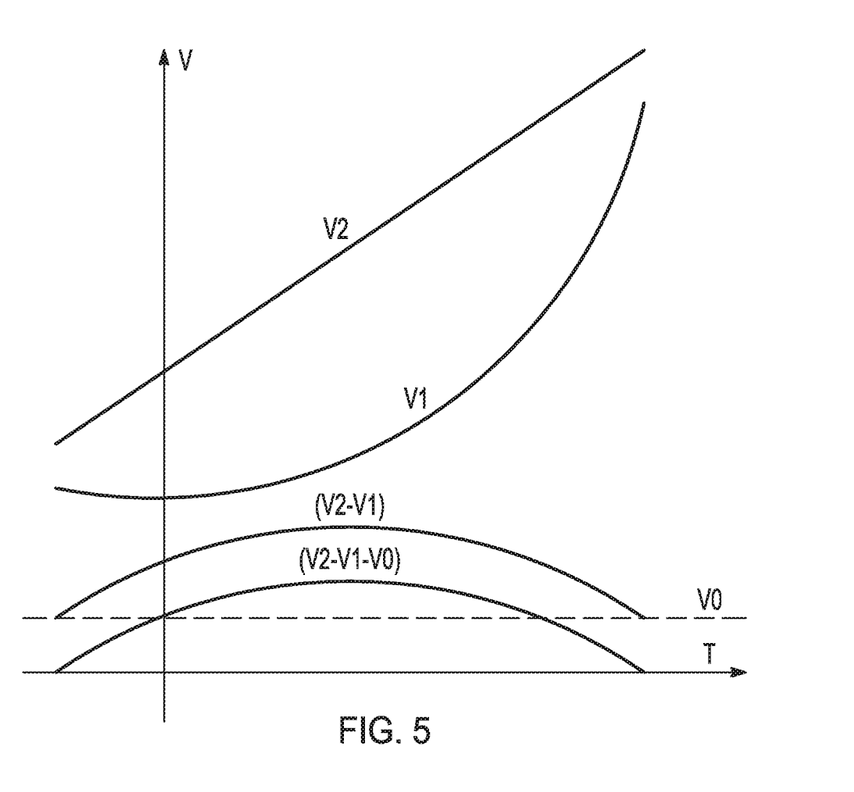
FIG. 5 is a graph showing waveforms associated with reducing offset error.

FIG. 5 is a graph showing the resulting waveforms V1 and V2. To produce an offset error correcting signal, the resistance of R2 is set so that the difference voltage (V2−V1) is the same value at temperature T2 as it is at temperature T1, or (V2−V1) at (T2)=(V2−V1) at (T1).

FIG. 5 shows the waveform (V2−V1) with the desired value of R2. A constant offset (VO) can be applied to the (V2−V1) signal to reduce the (V2−V1) waveform in FIG. 4 to the (V2−V1−VO) waveform. Resistor R2 may be a trimmable resistor in order to set the desired value for the random variation of the offset voltage. When the signal (V1−V2) is available, a second order temperature dependent component (e.g., $PTAT^2$ or $CTAT^2$) of the error correction signal can be generated and can be used to reduce the curved portion of the (V2−V1−VO) waveform even further.

Figure 6:
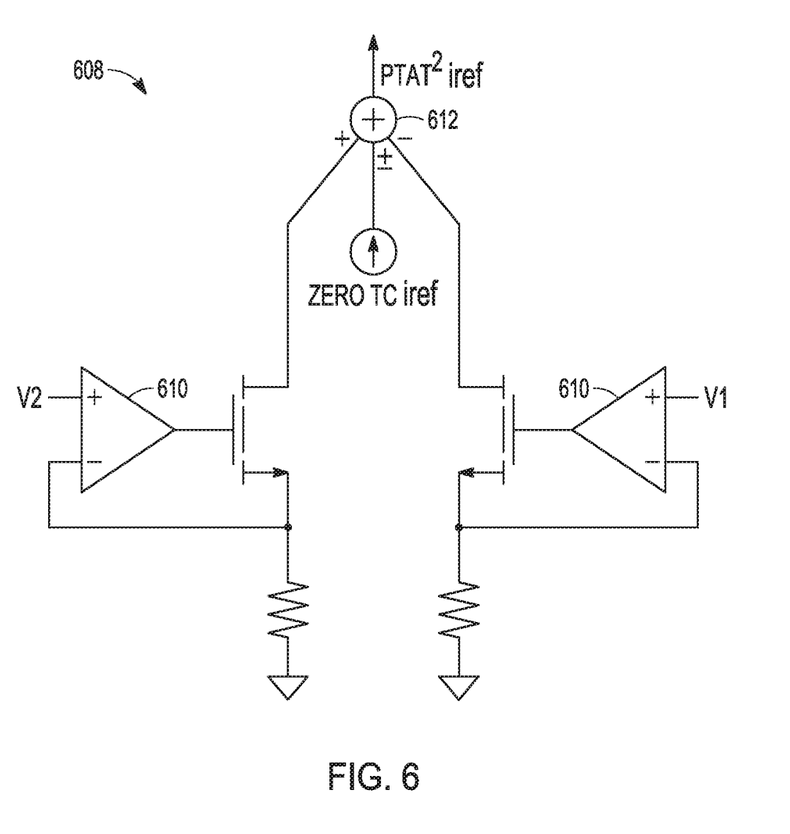
FIG. 6 is a diagram of a reference current circuit that generates a second order temperature dependent current.

FIG. 6 is a diagram of a reference current circuit 608 that generates a current Proportional to Absolute Temperature Squared reference current ($PTAT^2$ iref) that is used to correct the nonlinear portion of the offset error. In other aspects, the reference current circuit generates a Complementary to Absolute Temperature Squared reference current ($CTAT^2$ iref). The circuit receives the voltages V2 and V1 from the offset error correction circuit 406 of FIG. 4, and the $PTAT^2$ reference current is generated using the voltage difference V2−V1. Unity gain amplifiers 610 apply voltages V1 and V2 to resistors R. The $PTAT^2$ reference current is generated at a summing node 612 as a sum of (V2−V1)/R and a zero temperature coefficient reference current (zero TC iref).

Figure 7:
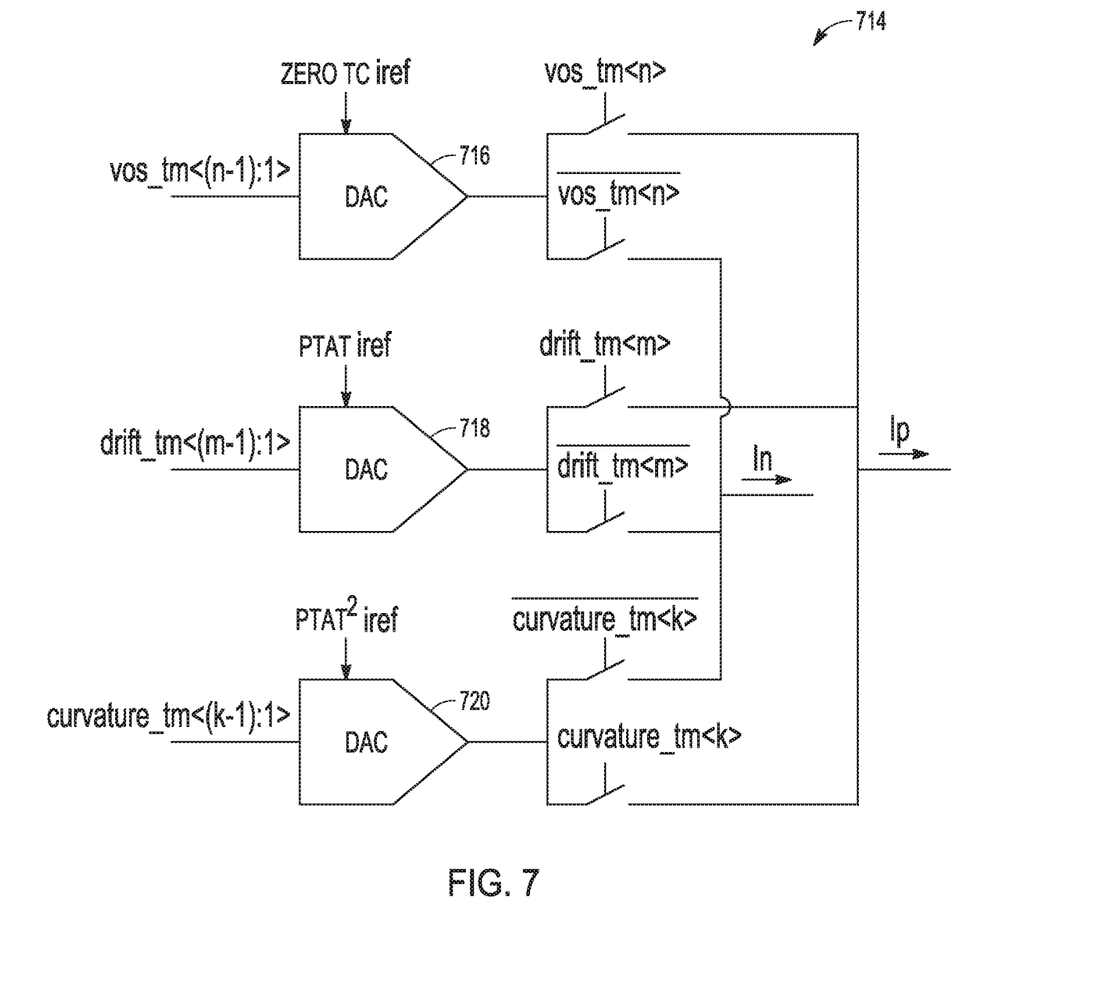
FIG. 7 is a diagram of a current trim circuit used to trim the error correction signals.

FIG. 7 is a diagram of a current trim circuit 714 used to trim the error correction signals of the offset error correction circuit. The error correction signals include a constant value reference current (zero TC iref), a PTAT reference current (PTAT iref), and a $PTAT^2$ reference current ($PTAT^2$ iref). In other aspects, the error correction signals include a constant value reference current, a CTAT reference current, and a $CTAT^2$ reference current. The current trim circuit 714 can include a separate digital-to-analog converter (DAC) circuit for each of the $PTAT^2$ current, the PTAT current, and the constant value current. DAC circuit 716 trims the constant value current (zero TC iref) using n trim bits (vos–tm<n−1:1>), DAC circuit 718 trims the PTAT current (PTAT iref) using m trim bits (drift–tm<m−1:1>), and DAC circuit 720 trims the $PTAT^2$ current $PTAT^2$ iref) using k trim bits (curvature–tm<k−1:1>). The error correction signals are combined using switch circuits 722 to generate error correction current signal Ip, and the inverse of the error correction signals are combined to generate error correction current signal In. The error correction current signals Ip and In are applied to the differential input stage to correct the offset error.

Figure 8A:
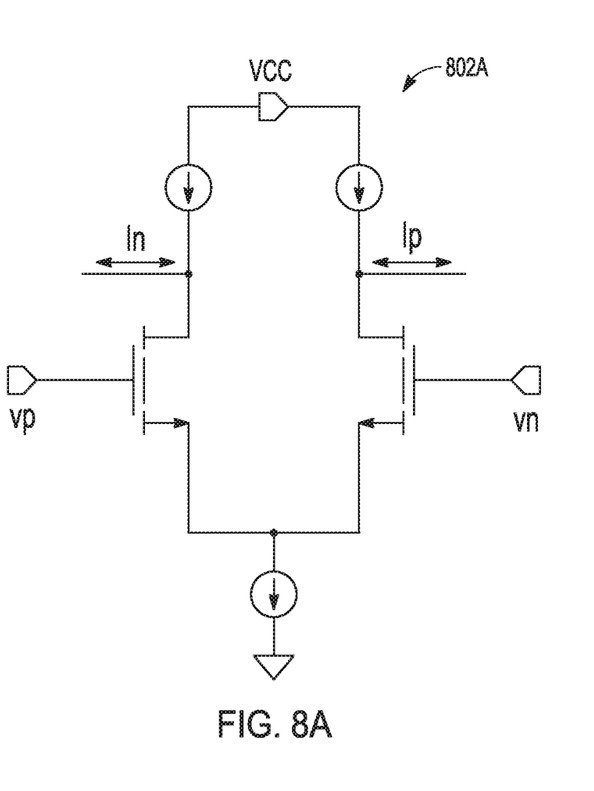
FIGS. 8A and 8B are circuit schematics of examples of a differential input stage circuit of an amplifier circuit
Figure 8B:
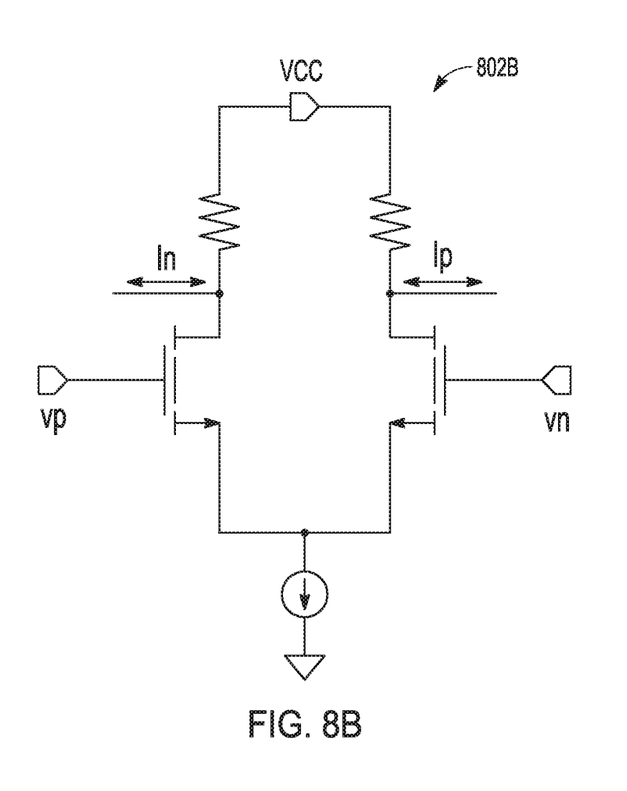

FIGS. 8A and 8B are circuit schematics of examples of differential input stage circuits of amplifier circuits. The differential input stages 802A, 802B each include a differential input transistor pair with the gates of the transistors coupled to the differential input (vp and vn) of the amplifier circuits. In the examples of FIGS. 8A and 8B, the error correction current signals Ip and In are applied directly to the differential input pair to correct the offset error. Because Ip and In each include a second order temperature dependent signal component, the error correction current signals Ip and In reduce or correct the nonlinear portion of the offset error present at the differential input stage.

Figure 9:
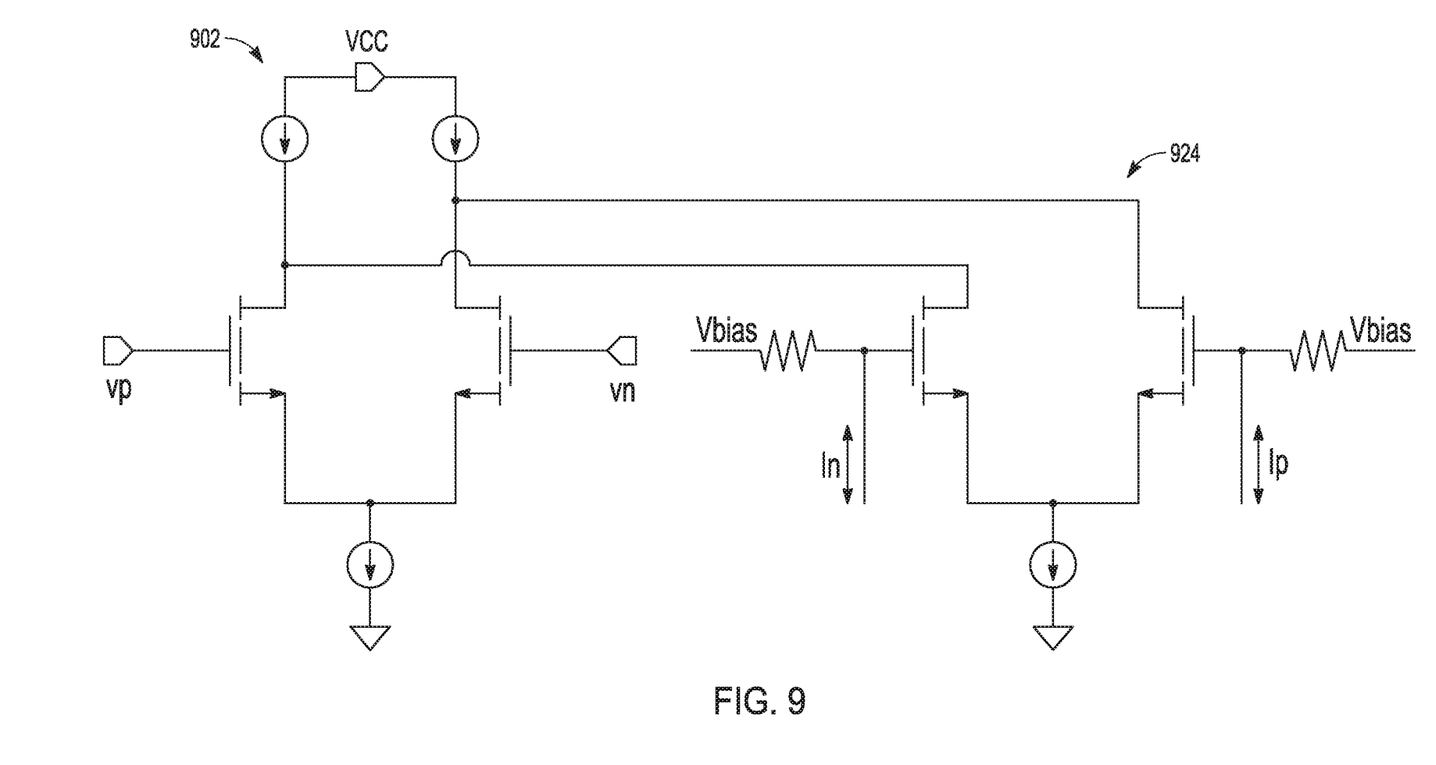
FIG. 9 is a circuit schematic of another example of a differential input stage circuit of an amplifier circuit.

FIG. 9 is a circuit schematic of another example of a differential input stage circuit of an amplifier circuit. The differential input stage 902 includes a primary differential input transistor pair, and the offset error correction circuit includes an auxiliary differential input transistor pair 924. The transistors of the auxiliary differential input transistor pair match the transistors of the primary differential input transistor pair. The error correction current signals Ip and In are applied directly to the auxiliary differential input transistor pair to generate an error correction voltage signal that is applied to the primary differential input transistor pair to correct the offset error. Because the error correction voltage signal is derived using the error correction current signals Ip and In that include a second order correction signal component, the error correction voltage signal includes a second order voltage signal component to reduce or correct the nonlinear portion of the offset error present at the primary differential input stage.

The devices, systems and methods described herein provide an amplifier circuit that is robust to variations in operating temperature. In the examples of the error correction circuits described herein, the constant value of the error correction signal and the linear or drift portion of the error correction signal may be trimmed at temperatures T1 and T2 (e.g., −40 degrees Celsius (° C.) and 55° C.) before the nonlinear portion of the error correction signal is trimmed.

Figure 10:
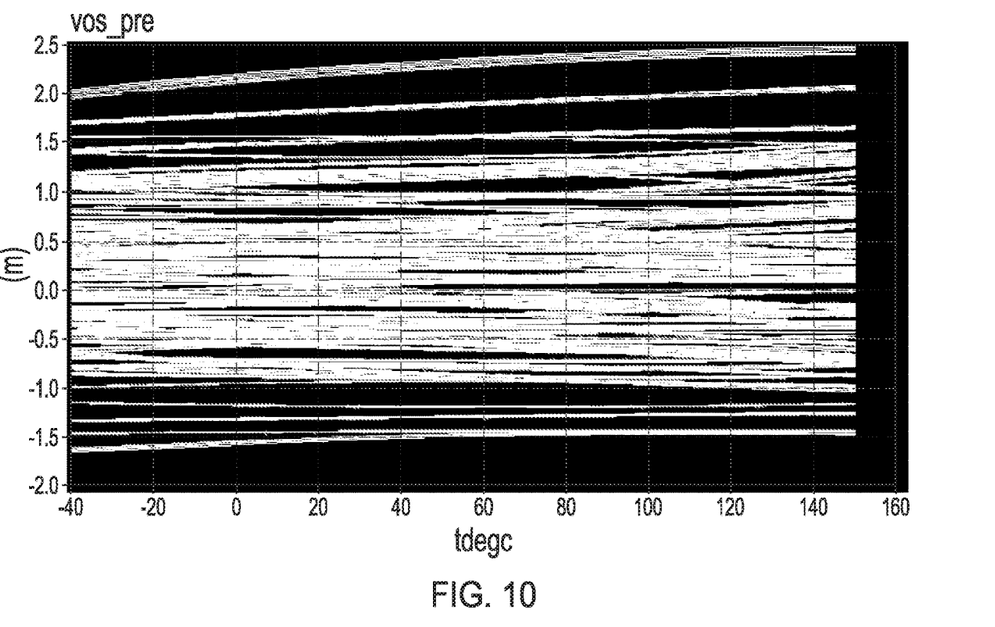
FIGS. 10-12 are simulation results showing examples of offset error correction for an amplifier.
Figure 11:
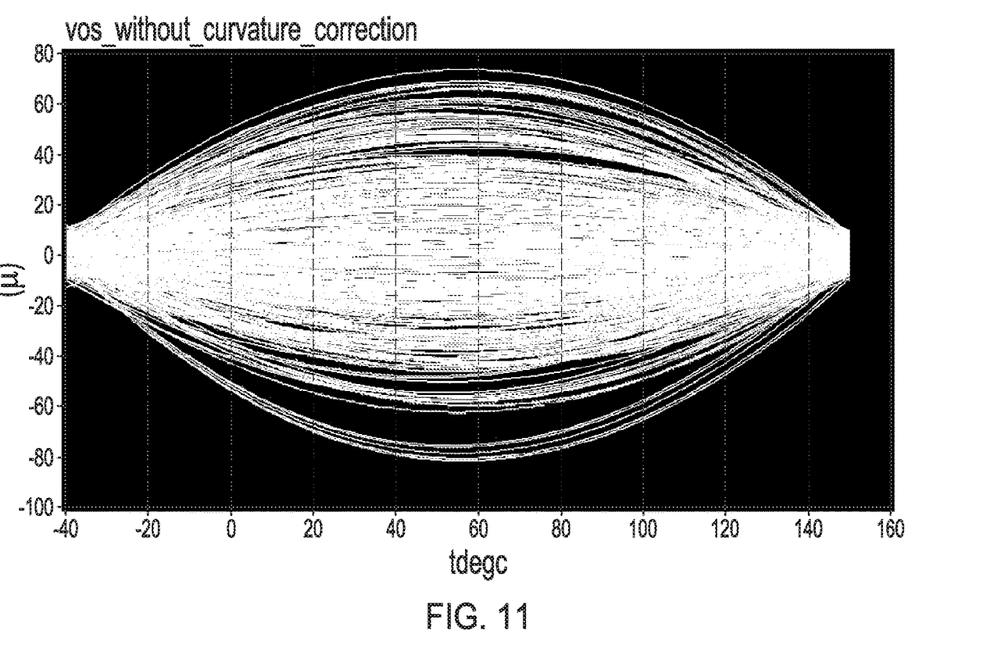
Figure 12:
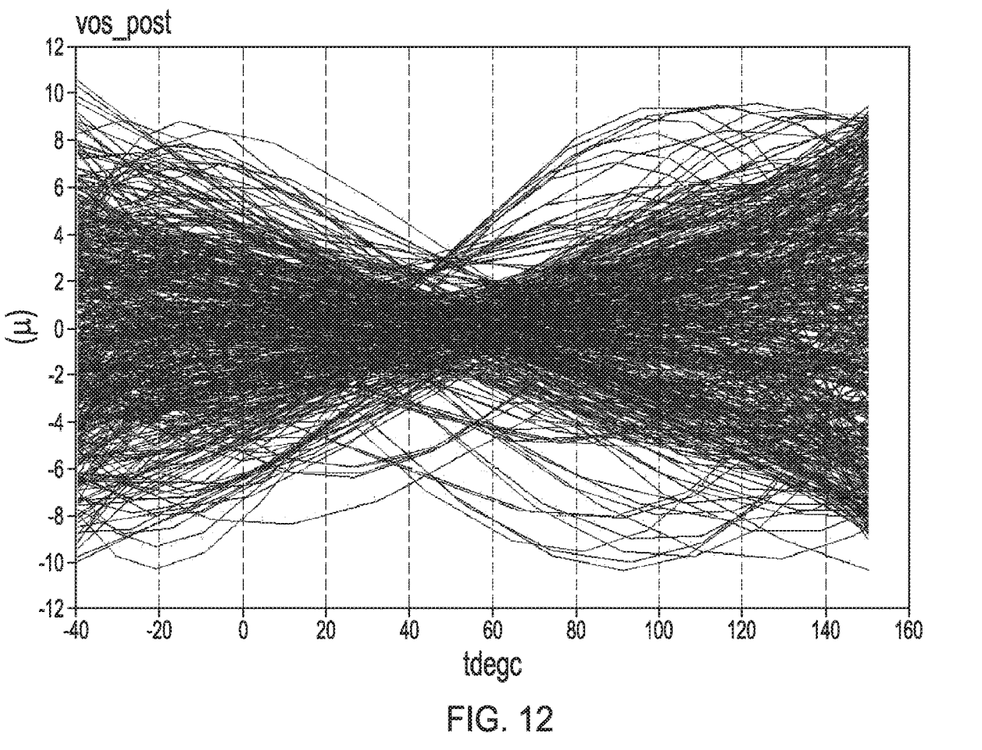

FIGS. 10-12 are simulation results showing examples of offset error correction for an amplifier designed in a commercial CMOS semiconductor process. The examples are the results of Monte Carlo simulation using 1111 trials with a device statistical model. FIG. 10 is a graph showing the distribution of offset voltage of 1111 amplifiers at different temperature from −40° C. to 150° C. Each curve represents one amplifier. The X-axis is temperature and Y-axis is offset error in millivolts (mV). No compensation has been applied in the example if FIG. 10. The offset error in the example of FIG. 10 is in the mV range.

FIG. 11 is a graph showing the distribution of residue offset voltage after the offset error is corrected at −40° C. and 150° C. using first order temperature dependent signals. In principle, all of the first order offset error voltage is removed from the amplifiers by the first order correction. Nonlinear or second order error compensation has not been applied in FIG. 11. It can be seen that the offset error in the example of FIG. 11 is reduced to microvolts (μV) by the first order compensation. It can be seen in FIG. 11 that the nonlinear or second order error becomes dominant after the first order correction. It can also be seen that the second order error is random in both magnitude and polarity are random. In principle, the error at the calibration temperatures −40° C. and 150° C. should be zero volts. However, due to finite resolution of the DAC circuits (e.g., DAC circuit 718 in FIG. 7), the error at −40° C. and 150° C. is between −10 μV and 10 μV. The DAC circuit can be used to adjust both the magnitude and polarity of the error correction signal (e.g., the second order component of In and Ip in FIG. 7).

FIG. 12 is a graph showing the residue offset error voltage after the 2nd order error at 55° C. is corrected with a second order temperature dependent signal. It can be seen in FIG. 12 that the residue error voltage now is substantially reduced. The residue error remaining is now due to the finite DAC resolution and higher order nonlinear error, where the finite DAC resolution is the dominant error source.

It can be seen in FIGS. 10-12 that using an error correction signal with a second order signal component can significantly reduce the offset to produce a precision amplifier circuit (e.g., a precision opamp, difference amplifier, or instrumentation amplifier). The actual trimming implemented to produce the results as in the simulation may be performed after packaging using in-package fuses.

ADDITIONAL DESCRIPTION AND ASPECTS

Aspect 1 can include subject matter (such as an amplifier circuit) comprising a differential input stage and an offset error correction circuit coupled to the differential input stage. The differential input stage is configured to receive a differential input signal, and the differential input stage is susceptible to an offset error that includes a linear offset error portion and a nonlinear offset error portion. The offset error correction circuit is configured to apply a second order error correction signal to the differential input stage to reduce the nonlinear portion of the offset error.

In Aspect 2, the subject matter of Aspect 1 optionally includes an offset error correction circuit configured to generate a second order error correction signal proportional to the square of the operating temperature of the amplifier circuit to reduce the nonlinear portion of the offset error.

In Aspect 3, the subject matter of Aspect 2 optionally includes an offset error correction circuit that includes: a first current source and a second current source that each provide a current having a first order dependency on temperature; a first circuit component having a resistance with a first temperature coefficient and electrically coupled to the first current source; and a second circuit component having a resistance with a second temperature coefficient and electrically coupled to the second current source, wherein the second temperature coefficient is different from the first temperature coefficient.

In Aspect 4, the subject matter of Aspect 3 optionally includes the first circuit component being included in a group consisting of polysilicon resistor, a diffusion resistor, and an n-well resistor; and wherein the second circuit component is a thin film resistor.

In Aspect 5, the subject matter of Aspect 3 optionally includes the second circuit component being a trimmable thin film resistor.

In Aspect 6, the subject matter of one of any combination of Examples 1-5 optionally includes an offset error correction circuit including a reference current circuit configured to generate a current signal having a second order dependency on temperature as the second order error correction signal and set a magnitude and polarity of the current signal according to the nonlinear portion of the offset error.

In Aspect 7, the subject matter of Aspect 6 optionally includes a reference current circuit configured to generate the current signal using a voltage difference signal having a second order temperature dependent voltage signal component.

In Aspect 8, the subject matter of one or both of Aspects 6 and 7 optionally includes an offset error correction circuit including a first current source configured to provide a first order temperature dependent current, and a second current source configured to provide a constant current having a constant current value. The second order error correction signal is a current signal including a second temperature dependent current, the first order temperature dependent current, and the constant current.

In Aspect 9, the subject matter of one or any combination of Aspects 6-8 optionally includes an offset error correction circuit including a current trim circuit configured to trim the values of the second order temperature dependent current, the first order temperature dependent current, and the constant current.

In Aspect 10, the subject matter of Aspect 9 optionally includes a current trim circuit includes a separate digital-to-analog converter (DAC) circuit for each of the second order temperature dependent current, the first order temperature dependent current, and the constant current.

In Aspect 11, the subject matter of one or any combination of Aspects 1-10 optionally includes the differential input stage including a primary differential input transistor pair, and an offset error correction circuit including an auxiliary differential input transistor pair matching the primary differential input transistor pair and electrically coupled to the primary differential input transistor pair; and a reference current circuit configured to generate a second order current signal and apply the second order current signal to the auxiliary differential input transistor pair to generate a second order voltage signal as the second order error correction signal.

In Aspect 12, the subject matter of one or any combination of Aspects 1-11 optionally includes a differential input stage including a differential input transistor pair; and an offset error correction circuit configured to generate a second order error correction signal that is a current signal including a proportional to absolute temperature squared (PTAT$^2$) component or complementary to absolute temperature squared (CTAT$^2$); and apply the current signal directly to the differential input transistor pair.

Aspect 13 can include subject matter (such as a method of correcting offset error in an amplifier circuit) or can optionally be combined with one or any combination of Aspects 1-12 to include such subject matter, comprising generating a second order error correction signal that includes a constant signal component, a first order temperature dependent signal component, and a second order temperature dependent signal component, and applying the generated second order error correction signal to a differential input stage of the amplifier circuit to reduce an offset error that includes a linear offset error portion and a nonlinear offset error portion, and the second order temperature dependent signal component includes a magnitude and a polarity to reduce the nonlinear offset error portion.

In Aspect 14, the subject matter of Aspect 13 optionally includes applying a generated second order error correction current signal to a differential input transistor pair of the differential input stage of the amplifier circuit.

In Aspect 15, the subject matter of one or both of Aspects 13 and 14 optionally includes applying a generated second order error correction current signal to an auxiliary differential input transistor pair matching a primary differential input transistor pair of the differential input stage to generate a second order error correction voltage signal, and applying the generated second order error correction voltage signal to the primary differential input transistor pair to correct the offset error.

In Aspect 16, the subject matter of one or any combination of Aspects 13-15 optionally includes generating the second order temperature dependent signal component using a voltage difference signal having a PTAT$^2$ voltage signal component.

In Aspect 17, the subject matter of one or any combination of Aspects 13-16 optionally includes generating a second order error correction signal generating trimmable values of a second order temperature dependent current, a first order temperature dependent current, and a constant current.

Aspect 18 can include subject matter (such as an operational amplifier circuit) or can optionally be combined with one or any combination of Examples 1-17 to include such subject matter, comprising a differential input stage configured to receive a differential input signal, wherein the differential input stage is susceptible to an offset error that includes a linear offset error portion and a nonlinear offset error portion, an output buffer stage coupled to the differential input stage, and an offset error correction circuit coupled to the differential input stage. The offset error correction circuit is configured to generate an error correction signal including a first order temperature dependent signal component, and a second order temperature dependent signal component, and apply the error correction signal to the differential input stage to reduce the linear offset error portion and the nonlinear offset error portion of the offset error.

In Aspect 19, the subject matter of Aspect 18 optionally includes a differential input includes a primary differential input transistor pair, and an offset error correction circuit that includes an auxiliary differential input transistor pair matching the primary differential input transistor pair and electrically coupled to the primary differential input transistor pair, and a reference current circuit configured to generate a second order error correction current signal and apply second order error correction current signal to the auxiliary differential input transistor pair to generate second order error correction voltage signal as the error correction signal.

In Aspect 20, the subject matter of one or both of Aspects 18 and 19 optionally includes a differential input stage including a differential input transistor pair, and an offset error correction circuit including a reference current circuit configured to generate a second order error correction current signal and to apply the second order error correction current signal directly to the differential input transistor pair to reduce the linear offset error portion and the nonlinear offset error portion of the offset error.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An amplifier circuit comprising:
   a differential input stage configured to receive a differential input signal, wherein the differential input stage is susceptible to an offset error that includes a linear offset error portion and a nonlinear offset error portion; and
   an offset error correction circuit coupled to the differential input stage and configured to apply a second order error correction signal to the differential input stage to reduce the nonlinear portion of the offset error.

2. The amplifier circuit of claim 1, wherein the offset error correction circuit is configured to generate a second order error correction signal proportional to the square of the operating temperature of the amplifier circuit to reduce the nonlinear portion of the offset error.

3. The amplifier circuit of claim 2, wherein the offset error correction circuit includes:
   a first current source and a second current source that each provide a current having a first order dependency on temperature;
   a first circuit component having a resistance with a first temperature coefficient and electrically coupled to the first current source; and
   a second circuit component having a resistance with a second temperature coefficient and electrically coupled to the second current source, wherein the second temperature coefficient is different from the first temperature coefficient.

4. The amplifier circuit of claim 3, wherein the first circuit component is included in a group consisting of polysilicon resistor, a diffusion resistor, and an n-well resistor; and wherein the second circuit component is a thin film resistor.

5. The amplifier circuit of claim 3, wherein the second circuit component is a trimmable thin film resistor.

6. The amplifier circuit of claim 1, wherein the offset error correction circuit includes a reference current circuit configured to generate a current signal having a second order dependency on temperature as the second order error correction signal and set a magnitude and polarity of the current signal according to the nonlinear portion of the offset error.

7. The amplifier circuit of claim 6, wherein the reference current circuit is configured to generate the current signal using a voltage difference signal having a second order temperature dependent voltage signal component.

8. The amplifier circuit of claim 6, wherein the offset error correction circuit includes a first current source configured to provide a first order temperature dependent current, and a second current source configured to provide a constant current having a constant current value, and the second order error correction signal is a current signal including a second temperature dependent current, the first order temperature dependent current, and the constant current.

9. The amplifier circuit of claim 6, wherein the offset error correction circuit includes a current trim circuit configured to trim the values of the second order temperature dependent current, the first order temperature current, and the constant current.

10. The amplifier circuit of claim 9, wherein the current trim circuit includes a separate digital-to-analog converter (DAC) circuit for each of the second order temperature dependent current, the first order temperature dependent current, and the constant current.

11. The amplifier circuit of claim 1, wherein:
    the differential input stage includes a primary differential input transistor pair; and
    the offset error correction circuit includes:
    an auxiliary differential input transistor pair matching the primary differential input transistor pair and electrically coupled to the primary differential input transistor pair; and
    a reference current circuit configured to generate a second order current signal and apply the second order current signal to the auxiliary differential input transistor pair to generate a second order voltage signal as the second order error correction signal.

12. The amplifier circuit of claim 1, wherein:
    the differential input stage includes a differential input transistor pair; and
    the offset error correction circuit is configured to:
    generate a second order error correction signal that is a current signal including a proportional to absolute temperature squared ($PTAT^2$) component or complementary to absolute temperature squared ($CTAT^2$); and
    apply the current signal directly to the differential input transistor pair.

13. A method of correcting offset error in an amplifier circuit, the method comprising:
    generating a second order error correction signal that includes a constant signal component, a first order temperature dependent signal component, and a second order temperature dependent signal component; and
    applying the generated second order error correction signal to a differential input stage of the amplifier circuit to reduce an offset error that includes a linear offset error portion and a nonlinear offset error portion, and the second order temperature dependent signal component includes a magnitude and a polarity to reduce the nonlinear offset error portion.

14. The method of claim 13, wherein applying the generated second order error correction signal to the differential input stage of the amplifier circuit includes applying a generated second order error correction current signal to a differential input transistor pair of the differential input stage of the amplifier circuit.

15. The method of claim 13, wherein applying the generated second order error correction signal to the differential input stage of the amplifier circuit includes:
    applying a generated second order error correction current signal to an auxiliary differential input transistor pair matching a primary differential input transistor pair of the differential input stage to generate a second order error correction voltage signal; and
    applying the generated second order error correction voltage signal to the primary differential input transistor pair to correct the offset error.

16. The method of claim 13, including generating the second order temperature dependent signal component using a voltage difference signal having a proportional to absolute temperature squared ($PTAT^2$) voltage signal component.

17. The method of claim 13, wherein generating a second order error correction signal generating trimmable values of a second order temperature dependent current, a first order temperature dependent current, and a constant current.

18. An operational amplifier circuit comprising:
    a differential input stage configured to receive a differential input signal, wherein the differential input stage is susceptible to an offset error that includes a linear offset error portion and a nonlinear offset error portion;
    an output buffer stage coupled to the differential input stage; and
    an offset error correction circuit coupled to the differential input stage and configured to:

generate an error correction signal including a first order temperature dependent signal component, and a second order temperature dependent signal component; and apply the error correction signal to the differential input stage to reduce the linear offset error portion and the nonlinear offset error portion of the offset error.

19. The operational amplifier circuit of claim 18, wherein:

the differential input includes a primary differential input transistor pair; and the offset error correction circuit includes:

an auxiliary differential input transistor pair matching the primary differential input transistor pair and electrically coupled to the primary differential input transistor pair; and a reference current circuit configured to generate a second order error correction current signal and apply second order error correction current signal to the auxiliary differential input transistor pair to generate second order error correction voltage signal as the error correction signal.

20. The operational amplifier circuit of claim 18, wherein:

the differential input stage includes a differential input transistor pair; and the offset error correction circuit includes a reference current circuit configured to generate a second order error correction current signal and to apply the second order error correction current signal directly to the differential input transistor pair to reduce the linear offset error portion and the nonlinear offset error portion of the offset error.

* * * * *